United States Patent
Hu et al.

(10) Patent No.: US 10,452,810 B2
(45) Date of Patent: Oct. 22, 2019

(54) ROAD NETWORK GENERATION

(71) Applicant: International Business Machines Corporation, Armonk, NY (US)

(72) Inventors: Guoqiang Hu, Shanghai (CN); Jiandong Ding, Shanghai (CN); Peng Ji, Shanghai (CN); Ning Duan, Beijing (CN); Jun Zhu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 1019 days.

(21) Appl. No.: 14/868,744

(22) Filed: Sep. 29, 2015

(65) Prior Publication Data

US 2016/0092621 A1  Mar. 31, 2016

(30) Foreign Application Priority Data

Sep. 30, 2014 (CN) .......................... 2014 1 0515332

(51) Int. Cl.
*G06G 7/48* (2006.01)
*G06F 17/50* (2006.01)
*G01C 21/32* (2006.01)

(52) U.S. Cl.
CPC .......... *G06F 17/509* (2013.01); *G01C 21/32* (2013.01)

(58) Field of Classification Search
CPC ................................... G06F 17/509
USPC ........................................ 703/6
See application file for complete search history.

(56) References Cited

U.S. PATENT DOCUMENTS

| | | | |
|---|---|---|---|
| 8,359,156 B2 | 1/2013 | Guo et al. | |
| 2009/0138188 A1 | 5/2009 | Kores et al. | |
| 2014/0089036 A1 | 3/2014 | Chidlovskii | |
| 2014/0164390 A1* | 6/2014 | Hampapur | G06F 17/30241 707/743 |
| 2015/0300835 A1* | 10/2015 | Fowe | G01C 21/20 701/410 |

FOREIGN PATENT DOCUMENTS

| | | |
|---|---|---|
| CN | 101267404 A | 9/2008 |
| CN | 101464158 A | 6/2009 |
| CN | 101984433 A | 3/2011 |
| CN | 103617731 A | 3/2014 |
| EP | 2 511 661 A2 | 10/2012 |
| JP | 10-123947 A | 5/1998 |
| JP | 2007073009 A | 3/2007 |

OTHER PUBLICATIONS

Xingjian et al. (Road Density Analysis Based on Skeleton Partyitioning for Road Generalization, 7 pages). (Year: 2009).*

(Continued)

*Primary Examiner* — Andre Pierre Louis
(74) *Attorney, Agent, or Firm* — Grant Johnson

(57) ABSTRACT

A method and an apparatus for generating a road network are disclosed. The method for generating a road network comprises: aggregating a plurality of grid cells partitioned in advance on a trajectory map based on trajectories in each grid cell of the plurality of grid cells to form level-1 regions; and generating a link of the road network by merging a level-1 region having two valid neighbors with its neighbor level-1 regions having two valid neighbors.

16 Claims, 8 Drawing Sheets

(56) References Cited

OTHER PUBLICATIONS

Andrienko, N. et al. "Spatial Generalization and Aggregation of Massive Movement Data", IEEE Transactions on Visualization and Coputer Graphics, vol. 16, No. X, 2010, pp. 1-15.

Karagiorgou S., et al. "On Vehicle Tracking Data-Based Road Network Generation", ACM SIGSPATIAL GIS, Nov. 6-9, 2012, 10 pages.

Biagioni, J. et al. "Inferring Road Maps From GPS Traces: Survey and Comparative Evaluation", 91st annual meeting of the transportation Research Board, Univerisy of Illinois Chicago, Nov. 15, 2011, pp. 1-21.

Kong, Q. et al., "A GPS-Track-Based Method for Automatically Generating Road-Network Vector Map", Proceedings of the 31st Chinese Control Conference, Jul. 25-27, 2012, pp. 7256-7260.

Liu, X. et al., "Road Density Analysis Based on Skeleton Partitioning for Road Generalization," Abstract, Jun. 2009, vol. 12, Issue 2. pp. 110-116.

\* cited by examiner

ROAD NETWORK GENERATION

BACKGROUND

The present invention relates to map inference technology, and more specifically, to a method for generating a road network and an apparatus thereof.

Recent years, the technology for road map inference using Global Position System (GPS) has attracted a lot of research interests, since in such technology, the road map is inferred from a significant amount of trajectory data of actual route traveled by vehicles obtained from GPS. In comparison to the traditional geographical survey approach, it is more efficient to infer the road map from GPS. In many applications, for example, trajectory pattern mining, travel activity analysis, vehicle fleet management, and etc., the inferred road map can be typically used to transform raw trajectories to abstract trajectories with reduced data size and/or enriched semantics.

A number of technologies have been developed to infer road maps using a great amount of trajectory data of actual routes traveled by vehicles obtained from GPS. Unfortunately, in the prior art, the generated road maps are routable fully functional road maps that can be used for navigation purpose. On one hand, individual GPS trajectories' geometrical features need to be computed for such fully functional road maps, which stands for significant computation overhead and is hardly scalable. For example, a map inference computation from about 1,000 GPS trajectories will take approximately one hour. On the other hand, traffic information for navigation contained in the fully functional road map is not necessary for applications other than navigation related applications, such as trajectory pattern mining, travel activity analysis, vehicle fleet management, and etc. Thus, the fully functional road map is redundant for these applications. Instead, maps with reduced data size can be used to facilitate transmission and storage.

Therefore, a technology is needed for generating a road map from raw GPS trajectory data in a more efficient and/or scalable manner.

SUMMARY

According to one embodiment of the present invention, there is provided a method for generating a road network. The method comprises aggregating a plurality of grid cells partitioned in advance on a trajectory map based on trajectories in each grid cell of the plurality of grid cells to form level-1 regions; and generating a link of the road network by merging a level-1 region having two valid neighbors with its neighbor level-1 regions having two valid neighbors.

According to another embodiment of the present invention, there is provided a road network generation apparatus. The apparatus comprises an aggregating part configured to aggregate a plurality of grid cells partitioned in advance on a trajectory map based on trajectories in each grid cell of the plurality of grid cells to form level-1 regions; and a link generation part configured to generate a link of the road network by merging a level-1 region having two valid neighbors with its neighbor level-1 regions having two valid neighbors.

According to still another embodiment of the present invention, there is provided a system for generating a road network. The system comprises means for aggregating a plurality of grid cells partitioned in advance on a trajectory map based on trajectories in each grid cell of the plurality of grid cells to form level-1 regions; and means for generating a link of the road network by merging a level-1 region having two valid neighbors with its neighbor level-1 regions having two valid neighbors.

BRIEF DESCRIPTION OF THE SEVERAL VIEWS OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Some embodiments of the present disclosure will be described in more detail with reference to the accompanying drawings, in which the embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
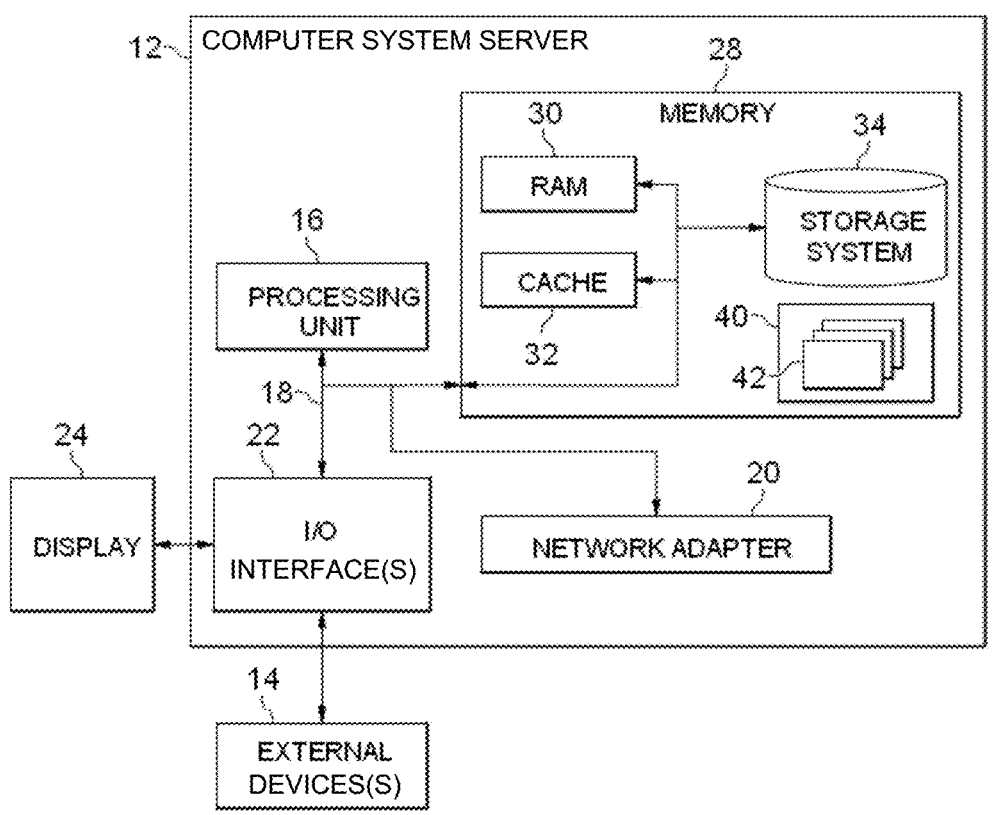
FIG. 1 shows the block diagram of an exemplary computer system/server which is applicable to implement the embodiments of the present invention.

In FIG. 1, an exemplary computer system/server 12 which is applicable to implement embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
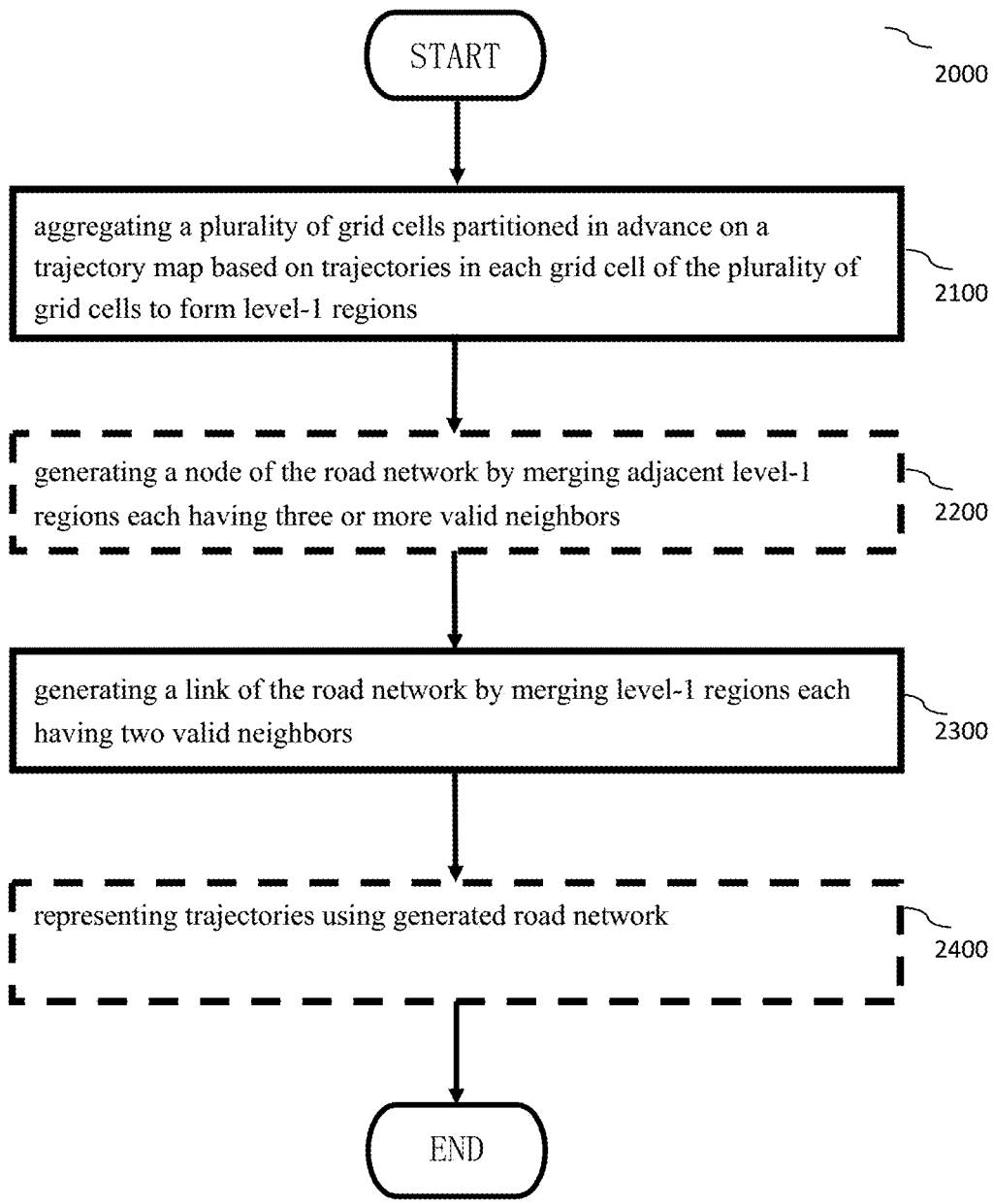
FIG. 2 shows an exemplary flowchart of a method for generating a road network according to one embodiment of the present invention.

With reference now to FIG. 2. FIG. 2 shows an exemplary flowchart of a method 2000 for generating a road network according to one embodiment of the present invention.

The method 2000 for generating a road network may comprise the following steps. At step 2100, a plurality of grid cells partitioned in advance on a trajectory map can be aggregated based on trajectories in each grid cell of the plurality of grid cells to form level-1 regions. At step 2200, nodes of the road network can be generated by merging a level-1 region having three or more valid neighbors with its neighbor level-1 regions having three or more valid neighbors. At step 2300, links of the road network can be generated by merging a level-1 region having two valid neighbors with its neighbor level-1 regions having two valid neighbors. At step 2400, trajectories can be represented using the generated road network. The step 2200 and step 2400 are not necessary for implementing the method for generating a road network according to the present invention and thus are optional steps which are drawn in dashed boxes. That is, according to one embodiment of the present invention, the method 2000 can only comprise the step 2100 of aggregating grid cells and the step 2300 of generating links of the road network, without impairing the implementation of the invention.

The method 2000 can be implemented on the computer system/server 12 as shown in FIG. 1, for example, or implemented on other machines. And, the method 2000 can be encoded as machine-readable instructions in software, hardware and firmware. It is noted that in the method 2000, the steps can be combined to be executed, and are not necessary to be executed in the described order. For example, steps 2200 and step 2300 can be interchanged without impairing the implementation of the invention. That is to say, after forming the level-1 regions at step 2100, links of the road network can be generated before the nodes of the road network are generated.

Each step in the method 2000 will be described below.

At step 2100, a plurality of grid cells partitioned in advance on a trajectory map can be aggregated based on trajectories in each grid cell of the plurality of grid cells, to form level-1 regions.

To fully illustrate the disclosure, the trajectory map and grid cells partitioned in advance on the trajectory map will be described first.

Figure 3:
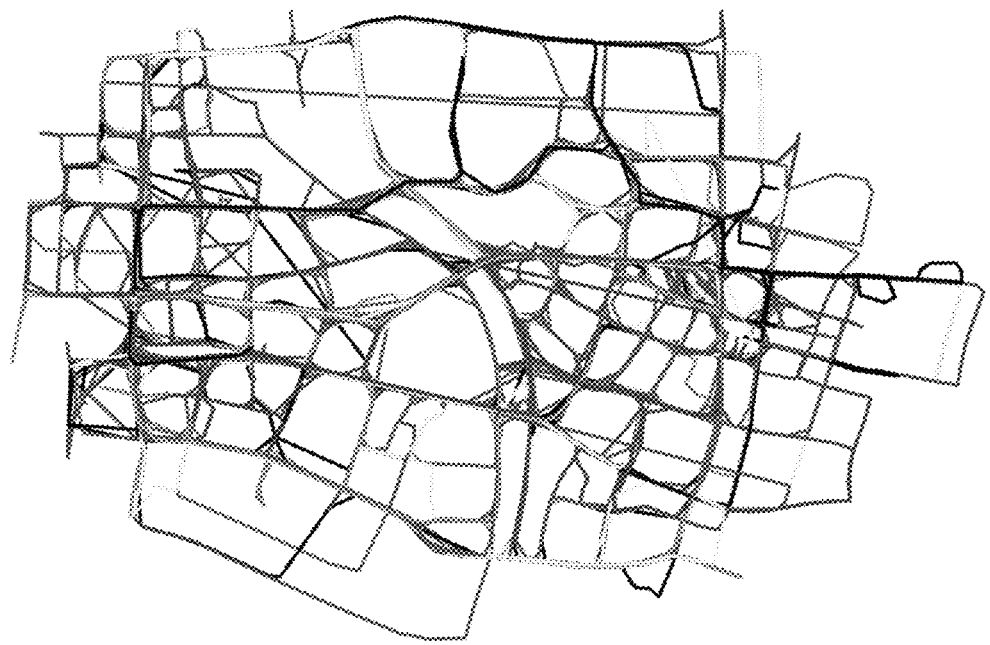
FIG. 3 shows an example of a trajectory map according to one embodiment of the present invention.

FIG. 3 shows an example of a trajectory map according to one embodiment of the present invention. As shown in FIG. 3, each line on the trajectory map represents a trajectory. The physical meaning of a trajectory can be an actual route traveled by a vehicle. The trajectories can be obtained by linking a sequence of position points from a positioning device (e.g., GPS). As an example, 576 trajectories can cover an area of 7×5 km.

The size of the plurality of grid cells can be set based on a preset spatial accuracy of the road network and a number limit of aggregated cells in each direction. The spatial accuracy of the road network refers to the desired spatial resolution of the road network, which is a variant input parameter in the method for generating a road network according to the invention. The spatial accuracy of the road network can be set by a user as needed or set in the system in advance. For example, the spatial accuracy can be set as 50 m, 100 m, 200 m, and etc. The number limit of aggregated cells refers to the maximum number of grid cells that can be aggregated in each direction in aggregating the grid cells into level-1 regions. The number limit of aggregated cells is also a variant input parameter in the method for generating a road network according to the invention, which can be set by a user as needed or set by the system. For example, the number limit of aggregated cells can be any natural number such as 1, 2, 3 . . . . . Grid cells are square lattices. The size of grid cells is equal to or less than a quotient obtained by dividing the spatial accuracy of the road network by the number limit of aggregated cells. For example, in the case that the spatial accuracy of the road network is set to 100 m and the number limit of aggregated cells is set to 2 in both the oriental and longitudinal directions, the length of the side of a grid cell can be equal to or less than 100÷2=50 m. That is, the grid cells can be 50 m×50 m lattices. In this situation, a trajectory map representing an area of 7×5 km will be covered by 14,000 grid cells. The number limit of aggregated cells in different directions may be the same or different.

Figure 4:
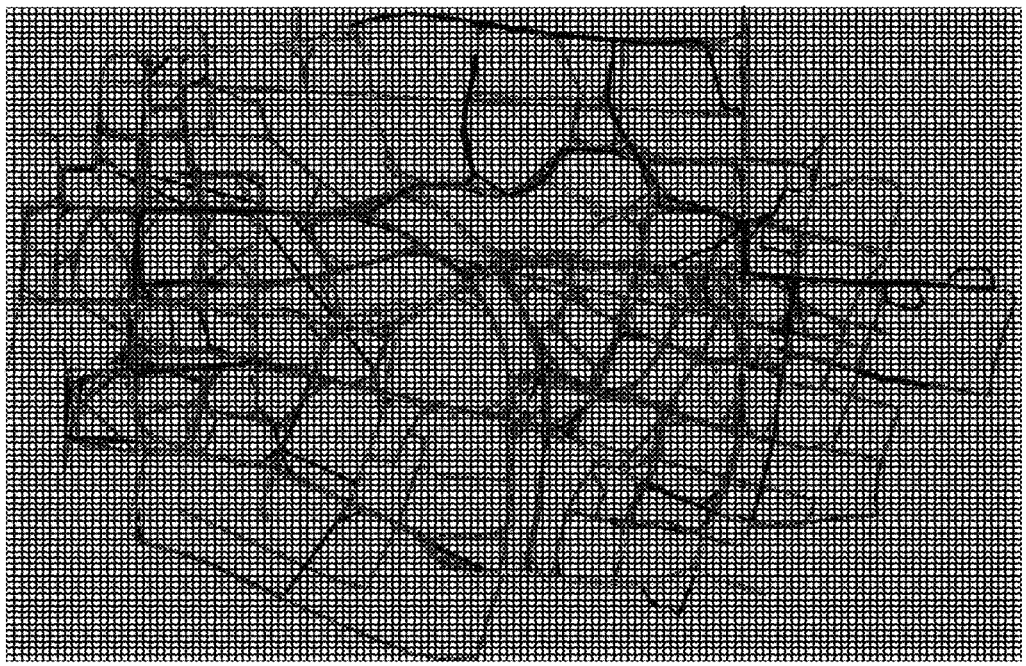
FIG. 4 shows a schematic view of a trajectory map covered by grid cells according to one embodiment of the present invention.

FIG. 4 shows a schematic view of a trajectory map covered by grid cells according to one embodiment of the present invention. In FIG. 4, the grid cells are shown in black solid line boxes.

Figure 5:
FIG. 5 shows a partial enlarged view of a trajectory map covered by grid cells according to one embodiment of the present invention.

FIG. 5 shows a partial enlarged view of a trajectory map covered by grid cells according to one embodiment of the present invention.

In FIG. 5, for clarity, the grid cells are shown as grey solid line boxes, while the trajectories are shown as black solid lines. It can be seen from FIG. 5, each trajectory is divided to several trajectory segments by the grid cells. However, not every grid cell contains at least one trajectory segment. For example, each one of the four grid cells in the ellipse 510 contains at least one trajectory segment, while the four grid cells in the ellipse 520 contains no trajectory segment.

One of the purposes for aggregating grid cells into level-1 regions is to discard grid cells containing no or very small number of trajectory segments. Due to the fact that the road network is constructed using trajectories in this disclosure, grid cells containing no trajectory segments need not to be considered in generating the road network. Grid cells containing very small number of trajectory segments are most likely caused by error/noise in location data. Therefore, grid cells not containing any trajectory segment or containing very small number of trajectory segments need not to be aggregated when aggregating grid cells. Meanwhile, since grid cells not containing no or very small number of trajectory segments need not to be handled in generating the road network, the data size used in the method for generating the road network according to the invention will be significantly reduced, and thus the computation complexity and required storage space will be significantly reduced.

Another purpose for aggregating grid cells into level-1 regions is to make a cluster of trajectories constituting of adjacent different trajectories fall in one region but not disperse into two grid cells.

Still referring to FIG. 5, in the four grid cells within the ellipse 510, for example, there is a cluster of trajectories comprising two adjacent trajectories. However, this cluster of trajectories locate across different grid cells. In order to further enhance the accuracy of the generated road network and reduce the computation complexity, different grid cells covering different trajectories in a same cluster of trajectories can be aggregated together to form a level-1 region.

Figure 6:
FIG. 6 shows a partial enlarged view of a trajectory map after the grid cells are aggregated as level-1 regions according to one embodiment of the present invention.

FIG. 6 shows a partial enlarged view of the trajectory map after the grid cells are aggregated as level-1 regions according to one embodiment of the present invention.

As shown in FIG. 6, grid cells not containing any trajectory segments have been discarded. Meanwhile, different grid cells covering different trajectories in a same cluster of trajectories have been aggregated together to form a plurality of level-1 regions. For example, the four grid cells in the ellipse 510 as shown in FIG. 5 have been aggregated as the level-1 region 610 in FIG. 6.

Embodiments will be described for aggregating a plurality of grid cells partitioned in advance on a trajectory map based on trajectories in each grid cell of the plurality of grid cells to form level-1 regions.

At step 2100 of aggregating grid cells to form level-1 regions, a plurality of grid cells can be aggregated based on a density of trajectories in each grid cell of the plurality of grid cells partitioned in advance on the trajectory map. That is, grid cells with high density are aggregated first. In the case that the number limit of aggregated cells is not reached, if it is determined in an adjacent grid cell of a present grid cell that there are enough trajectories differing from the trajectories in the present grid cell, the present grid cell and the adjacent grid cell are aggregated; otherwise, the present grid cell is taken as a level-1 region.

To meet the requirement on the spatial accuracy of the road network, there is an upper limit for the number of aggregated grid cells. For example, as mentioned previously, if the spatial accuracy of the road network is 100 m, and the number limits of aggregated cells are 2 both in the oriental and longitudinal directions, the size of a grid cell is 50×50 m. When the present grid cell is aggregated with the adjacent grid cell, the size of the level-1 region formed by aggregation is the total size of two grid cells, i.e., 50×100 m or 100×50 m. At this time, the number of aggregated cells has reached the upper limit. Continuing the aggregation will result in a size greater than 100 m for the level-1 region and thus the final generated road network will not meet the requirement on the spatial accuracy. In another case, if the spatial accuracy of the road network is still 100 m, but the number limits of aggregated cells are 4 both in the oriental and longitudinal directions, the size of a grid cell will be 25×25 m. Then 1-4 grid cells can be aggregated in the oriental and longitudinal directions and the final generated road network will still meet the requirement on the spatial accuracy.

The aggregation of grid cells is based on the density of trajectories in the grid cells. As mentioned above, grid cells containing no or very small number of trajectory segments will not be aggregated. Furthermore, the grid cells are aggregated to make the cluster of trajectories constituting of adjacent trajectory not distribute across two grid cells as possible as they can. In this case, it can be determined in an adjacent grid cell of a present grid cell whether there are enough trajectories differing from the trajectories in the present grid cell. If in an adjacent grid cell of a present grid cell there is a trajectory different from the trajectories in the present grid cell, the trajectory in the adjacent grid cell and the trajectories in the present grid cell belong to a same cluster of trajectories. If the number limit of aggregated cells has not been reached, the present grid cell and the adjacent grid cell can be aggregated. The number of trajectories in the aggregated region will greater than the number of trajectories in any aggregated grid cell. The aggregation can save the computation amount in following stages and improve the accuracy of the generated road network. It is noted that there can be a situation in which all trajectories passing the present grid cell are exactly those passing an adjacent grid cell. In this situation, it is not considered that there are trajectories in the adjacent grid cell other than those in the present grid cell. That is, the present grid cell and the adjacent grid cell will not be aggregated in this situation.

Those skilled in the art will appreciate that there can be a number of embodiments to determine whether there are enough trajectories different from the trajectories in the present grid cell in the adjacent grid cell of the present grid cell. For example, in one embodiment, the flowchart as shown in FIG. 7 can be used to make the determination.

Figure 7:
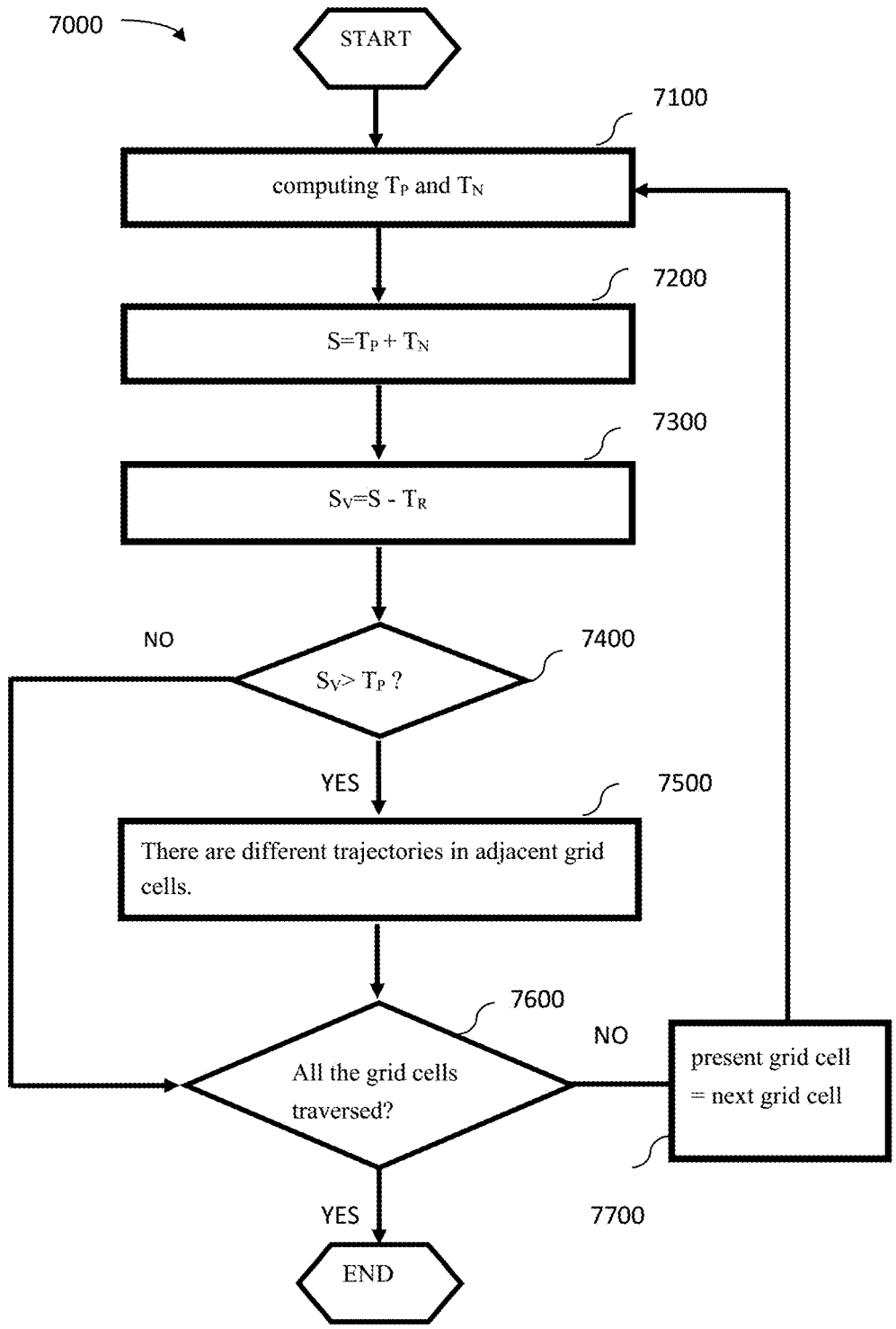
FIG. 7 shows a flowchart of a method for determining in an adjacent grid cell there is a trajectory different from the trajectories in the present grid cell according to one embodiment of the present invention.

FIG. 7 shows a flowchart of a method 7000 for determining in an adjacent grid cell there is a trajectory different from the trajectories in the present grid cell according to one embodiment of the present invention.

As shown in FIG. 7, at step 7100, the number $T_P$ of trajectory segments in the present grid cell and the number $T_N$ of trajectory segments in the adjacent grid cell are computed. Those skilled in the art will appreciate that there can be a number of ways to compute the number of trajectory segments in a grid cell. In one implementation, the trajectories can be obtained from data of a positioning device such as GPS. In this case, a sequence of position points (e.g., GPS points) contained in each trajectory can be scanned for the computation. The sequence of position points can be obtained by positioning (e.g., GPS positioning). That is, for each trajectory, coordinates of each position point in the sequence of position points and coordinates of the grid cell are compared to determine whether the position point is within the grid cell.

At step 7200, the computed number $T_P$ of trajectory segments in the present grid cell is added to the computed number $T_N$ of trajectory segments in the adjacent grid cell to get the sum number of trajectory segments, $S=T_P+T_N$.

At step 7300, a number $T_R$ of trajectory segments in the adjacent grid cell, which are located on a same trajectory as the trajectory segments in the present grid cell, is subtracted from the obtained sum number S of trajectory segments, to get a sum number of valid trajectory segments, $S_V=S-T_R$.

At step 7400, it is determined whether the sum number $S_V$ of valid trajectory segments is greater than the number $T_P$ of trajectory segments in the present grid cell. In an alternative embodiment, to determine whether there are enough trajectories differing from the trajectories in the present grid cell, a threshold value can be specified. In this case, it is determined whether the sum number $S_V$ of valid trajectory segments exceeds the number $T_P$ of trajectory segments in the present grid cell by the threshold value in order to conclude there are "enough" different trajectories there.

If the determination result of step 7400 is YES, the method proceeds to step 7500 to determine in the adjacent grid cell adjacent of the present grid cell that there is a trajectory different from the trajectories in the present grid cell.

Then the method proceeds to step 7600 to determine whether all the grid cells have been traversed.

If the determination result of step 7400 is NO, the method proceeds to step 7600 to determine whether all the grid cells have been traversed.

If the determination result of step 7600 is YES, the flow ends.

If the determination result of step 7600 is NO, the method proceeds to step 7700 to take a next grid cell as the present grid cell and then returns to step 7200.

Through the above description, those skilled in the art have known how to aggregate a plurality of grid cells partitioned in advance on a trajectory map based on trajectories in each grid cell of the plurality of grid cells to form level-1 regions. Now it will describe generating the nodes and links of road network based on the formed level-1 regions.

Figure 8:
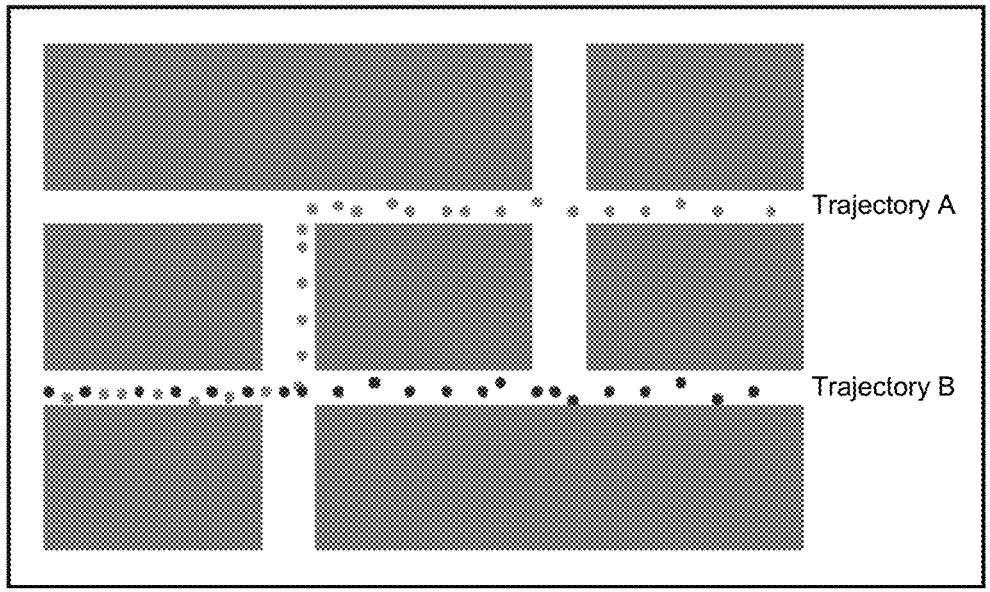
FIG. 8 shows a schematic actual map with roads represented by blanks intervening between blocks filled in grey.

FIG. 8 shows a schematic actual map. In FIG. 8, regions such as buildings and greenbelt that cannot be traveled through are represented by blocks filled in grey, and roads are represented by blanks intervening between the grey blocks.

Figure 9:
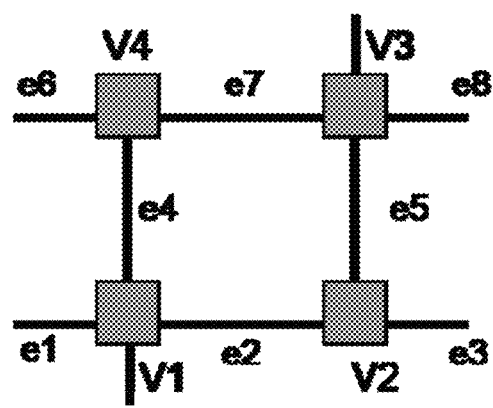
FIG. 9 shows a road network map according to the map in FIG. 8, generated according to one embodiment of the present invention.

FIG. 9 shows a road network map corresponding to the map in FIG. 8, generated according to one embodiment of the present invention. As shown in FIG. 9, according to one embodiment of the invention, the road network is constituted of two parts, i.e., nodes and links. Nodes correspond to the crosses, turnings and etc. in FIG. 8. Links correspond to road segments in FIG. 8. The road network as shown in FIG. 9 comprises four nodes, V1, V2, V3 and V4, and eight links, e1, e2, e3, e4, e5, e6, e7 and e8. It is noted that structure of the road network is specific to applications. Different applications may need different parts of the road network. For example, according to one embodiment of the invention, the road network can be constituted by links only. According to another embodiment of the invention, the road network can be constituted by nodes only. To make the description of the invention more comprehensive, a road network comprising both nodes and links will be illustrated as an example hereinafter to set forth the principle of the invention.

Detailed steps for generating nodes and links of a road network will be described.

To facilitate the understanding of the invention, concepts for "neighbor level-1 region" and "valid neighbor" according to the invention will be defined first.

Neighbor

A level-1 region B is called a neighbor level-1 region of a level-1 region A when it satisfies any of the following two conditions:

(i) The level-1 region B meets at least in part with the level-1 region A at an edge; or (ii) The level-1 region B meets with the level-1 region A on a corner, and there is no other level-1 region, which meets at least in part with the level-1 region A at an edge, meets at least in part with the level-1 region B at an edge.

Figure 10:
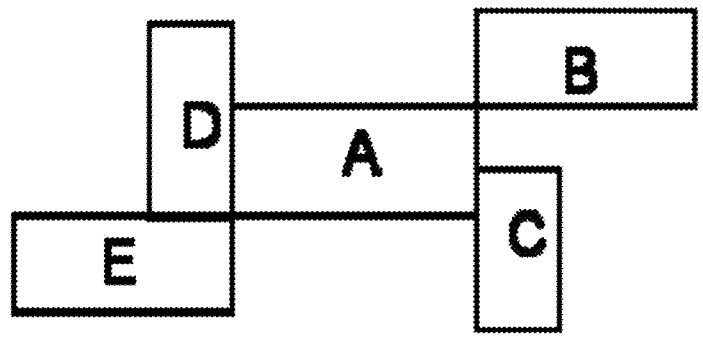
FIG. 10 is a view illustrating the concept of neighbor level-1 regions according to the present invention.

FIG. 10 is a view illustrating the concept of neighbor level-1 regions according to the present invention.

As shown in FIG. 10, regions A, B, C, D and E are level-1 regions formed by aggregating grid cells. In FIG. 10, both of the level-1 regions C and D meet in part with the level-1 region A at an edge and thus satisfy the condition (i). Therefore, the level-1 regions C and D are neighbor level-1 regions of the level-1 region A. The level-1 region B meets with the level-1 region A at a corner. Furthermore, none of the level-1 regions C and D, which meet at least in part with the level-1 region A at an edge, meets at least in part with the level-1 region B at an edge. Therefore, the level-1 region B is a neighbor level-1 region of the level-1 region A due to the fact that it satisfies the condition (ii). However, as for the level-1 region E, although it meets with the level-1 region A at a corner, it meets in part with the level-1 region D at an edge and the level-1 region D meets in part with the level-1 region A at an edge. That is, the level-1 region E satisfies neither condition (i) nor condition (ii). The level-1 region E is not a neighbor level-1 region of the level-1 region A.

Valid Neighbor

A level-1 region B is called a valid neighbor of a level-1 region A when it satisfies the following two conditions at the same time:

(i) The level-1 region B is a neighbor level-1 region of the level-1 region A; and (ii) The level-1 region B has at least one neighbor level-1 region, in addition to the level-1 region A, which is not a neighbor level-1 region of the level-1 region A.

Figure 11:
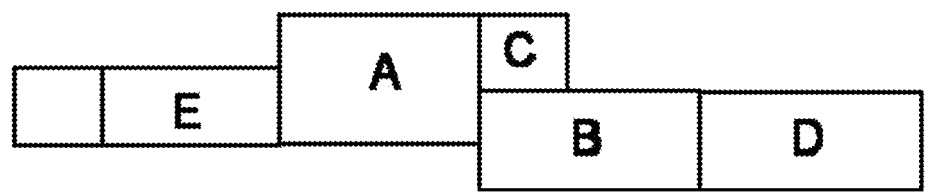
FIG. 11 is a view illustrating the concept of valid neighbors according to the present invention.

FIG. 11 is a view illustrating the concept of valid neighbors according to the present invention.

As shown in FIG. 11, regions A, B, C, D and E are level-1 regions formed by aggregating grid cells. Level-1 regions B, C and E are neighbor level-1 regions of the level-1 region A, i.e., they satisfy the condition (i). For the level-1 regions B and E, there is another neighbor level-1 region, in addition to the level-1 region A, which is not a neighbor level-1 region of the level-1 region A. For example, the level-1 region B has a neighbor level-1 region D in addition to the level-1 region A, and the level-1 region D is not a neighbor level-1 region of the level-1 region A. That is, the level-1 regions B and E further satisfy the condition (ii) and thus are valid neighbors of the level-1 region A. Now the level-1 region C is considered. Although the level-1 region C has a neighbor level-1 region, B, in addition to the level-1 region A, the level-1 region B is also a neighbor level-1 region of the level-1 region A. Therefore, the level-1 region C is not a valid neighbor of the level-1 region A since it does not satisfy the condition (ii).

The inventors of the invention found that, after aggregating grid cells according to the above-mentioned embodiments of the invention, the formed level-1 regions have the following features. The level-1 regions covering nodes of the road network typically have three or more valid neighbors, wherein nodes of the road network correspond to crossing, converging or bifurcating places of the clusters of trajectories. The level-1 regions covering links of the road network typically have only two valid neighbors, wherein links of the road network correspond to the cluster of trajectories on a single road segment. As a result, level-1 regions having the same feature can be merged based on the above rules to generate nodes and links of the road network respectively.

Refers back to FIG. 2. At step 2200, a node of the road network can be generated by merging a level-1 region having three or more valid neighbors with its neighbor level-1 regions having three or more valid neighbors.

Figure 12:
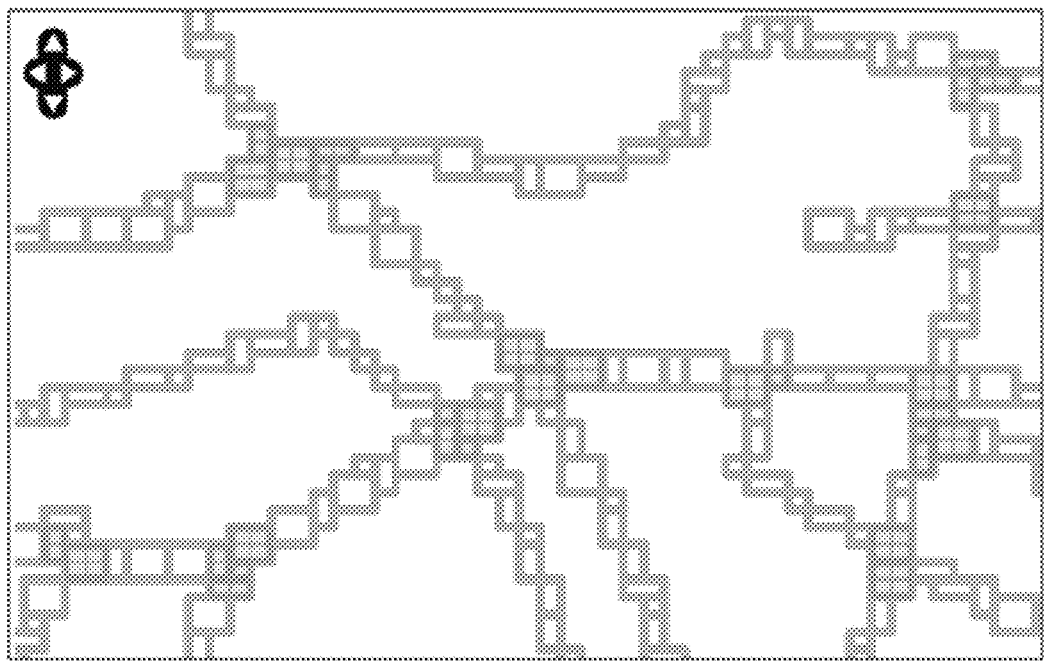
FIG. 12 shows a road network including nodes and links generated according to one embodiment of the present invention.

FIG. 12 shows a road network including nodes and links generated according to one embodiment of the present invention.

As shown in FIG. 12, each level-1 region is represented by a thick solid line box. Among others, boxes filled in grey represent the level-1 regions that can be merged to be nodes of the road network.

At step 2300, a link of the road network can be generated by merging a level-1 region having two valid neighbors with its neighbor level-1 regions having two valid neighbors. In FIG. 12, unfilled boxes represent level-1 regions that can be merged to be links of the road network.

As a result, a road network according to the invention as shown in FIG. 9 has been generated.

In the method flow as shown in FIG. 2, at step 2400, i.e., after generating the road network, the trajectories can be represented using the generated road network.

Referring back to FIG. 8, two trajectories, A and B, constituting of sequences of position points (e.g., GPS points) are shown. In one embodiment, using the road network as shown in FIG. 9, each trajectory can be represented by nodes and/or links in the road network. For example, the trajectory A can be represented as a set of nodes and links { . . . , e1, V1, e4, V4, e7, V3, e8, . . . }. The trajectory B can be represented as a set of nodes and links { . . . , e1, V1, e2, V2, e3, . . . }. In another embodiment, each trajectory can be represented only by links in the road network. For example, the trajectory A can be represented as the a of links { . . . , e1, e4, e7, e8, . . . }. The trajectory B can be represented as a set of links { . . . , e1, e2, e3, . . . }. In still another embodiment, each trajectory can be represented only by nodes in the road network. For example, the trajectory A can be represented as a set of nodes { . . . , V1, V4, V3, . . . }. The trajectory B can be represented as a set of nodes { . . . , V1, V2, . . . }. Which representation will be adopted depends on the demand by applications.

Since the position points such as GPS points have a relatively high accuracy, it will consume significant storage space to represent trajectories using a large amount of position points. Furthermore, the computation amount will be relatively high for recognition and comparison of trajectories and the like. In contrast, in the case of using the road network according to the invention to represent trajectories, the resulted data amount is very small, which not only saves storage space, but also significantly reduces computation overheads in recognition and comparison of trajectories and the like. Meanwhile, representing trajectories using the road network according to the invention can also reduce uncertainty of trajectories. Therefore, representing trajectories using the road network according to the invention benefits for pattern mining tasks such as popular route mining, trajectory comparison, and etc.

Computation overhead for the above described method for generating a road network mainly comprises overheads in the following two phases:

Phase 1: scanning the sequence of position points for each trajectory

Phase 2: aggregating grid cells and merging level-1 regions

Computation overheads for phase 1 mainly depend on the size of data set of trajectory data. Computation overheads for phase 2 mainly depend on the geo-spatial size. The execution times in each phase obtained by simulation to 576 trajectories in an area of 7×5 km on the laptop Lenovo® T410, and hereby estimated execution times in each phase to be consumed by computation on 1,000,000 trajectories covering the Beijing city (about 500 km$^2$) are shown in Table 1.

TABLE 1

|  | simulation to 576 trajectories in an area of 7 × 5 km on the laptop Lenovo ® T410 | Estimation for computation on 1,000,000 trajectories covering the Beijing city (about 500 km$^2$) |
| --- | --- | --- |
| Phase 1 execution time (without disk-I/O overhead) | 351 ms | 609.4 s |
| Phase 2 execution time | 445 ms | 6.4 s |
| Total execution time | 796 ms | 615.8 s |

It can be seen from Table 1 that, in the method for generating road network according to the invention, when simulation is made to the 576 trajectories in an area of 7×5 km, execution times needed by phase 1 and phase 2 are 351 ms and 445 ms respectively, which are in a same order of magnitude. However, as the number of trajectories and geographical area increase, the execution time is 609.4 s for phase 1 and only 6.4 s for phase 2 when the road network is generated for Beijing city. The execution time for phase 2 has been two orders of magnitude shorter than that for phase 1. This is because, the execution time needed by phase 1 increases proportionally to the amount of trajectories, while the execution time needed by phase 2 only increases with the increasing of geographical area and is not related to the amount of trajectories, and thus increases much slower than the execution time needed by phase 1.

This feature makes the method for generating a road network according to the invention advantageous when applied in city areas typically having dense trajectories.

Figure 13:
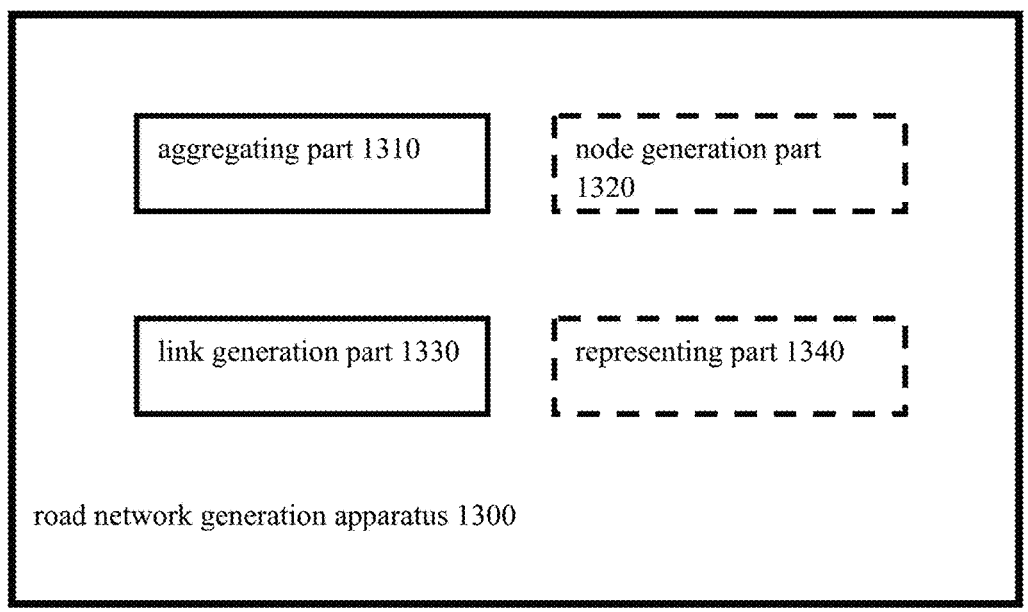
FIG. 13 shows a block diagram of the road network generation apparatus according to one embodiment of the present invention.

FIG. 13 shows a block diagram of the road network generation apparatus 1300 according to one embodiment of the present invention.

Each parts of the road network generation apparatus 1300 can be implemented in hardware, software, firmware or combination thereof. Those skilled in the art will appreciate that the parts as shown in FIG. 13 may be combined or separated to implement the principle of the invention. For example, the node generation part 1320 and link generation part 1330 can be combined together to be one generation part.

As shown in FIG. 13, the road network generation apparatus 1300 comprises an aggregating part 1310 and a link generation part 1330. The aggregating part 1310 can be configured to aggregate a plurality of grid cells partitioned in advance on a trajectory map based on trajectories in each grid cell of the plurality of grid cells to form level-1 regions. The link generation part 1330 can be configured to generate a link of the road network by merging a level-1 region having two valid neighbors with its neighbor level-1 regions having two valid neighbors.

According to one embodiment of the invention, the road network generation apparatus 1300 can further comprise an optional node generation part 1320 (shown as a dashed box in FIG. 13). The node generation part 1320 can be configured to generate a node of the road network by merging a level-1 region having three or more valid neighbors with its neighbor level-1 regions having three or more valid neighbors.

According to one embodiment of the invention, the road network generation apparatus 1300 can further comprise an optional representing part 1340 (shown as a dashed box in FIG. 13). The representing part 1340 can be configured to represent trajectories using generated road network.

According to one embodiment of the invention, the aggregating part 1310 aggregates the grid cells based on a density of trajectories in each grid cell of a plurality of grid cells partitioned in advance on the trajectory map.

According to one embodiment of the invention, the size of the plurality of grid cells can be set based on a preset spatial accuracy of the road network and a number limit of aggregated cells in each direction.

According to one embodiment of the invention, the size of the plurality of grid cells can be equal to or less than a quotient obtained by dividing the spatial accuracy of the road network by the number limit of aggregated cells.

According to one embodiment of the invention, the aggregating the plurality of grid cells based on a density of trajectories in each grid cell of the plurality of grid cells partitioned in advance on the trajectory map can comprise: in the case that the number limit of aggregated cells is not reached, if it is determined that in an adjacent grid cell of a present grid cell there are enough trajectories different from the trajectories in the present grid cell, aggregating the present grid cell and the adjacent grid cell, otherwise, taking the present grid cell as a level-1 region.

According to one embodiment of the invention, the determining that in the adjacent grid cell adjacent of the present grid cell there are enough trajectories different from the trajectories in the present grid cell can comprise: computing a number of trajectory segments in the present grid cell and a number of trajectory segments in the adjacent grid cell; adding a computed number of trajectory segments in the present grid cell and a computed number of trajectory segments in the adjacent grid cell, to get a sum number of trajectory segments; subtracting a number of trajectory segments in the adjacent grid cell, which are located on a same trajectory as the trajectory segments in the present grid cell, from the sum number of trajectory segments, to get a sum number of valid trajectory segments; and determining that in the adjacent grid cell adjacent of the present grid cell there are enough trajectories different from the trajectories in the present grid cell, if the sum number of valid trajectory segments exceeds the number of trajectory segments in the present grid cell by a certain amount.

According to one embodiment of the invention, the computing the number of trajectory segments in the present grid cell and the number of trajectory segments in the adjacent grid cell can comprise scanning a sequence of position points contained in each trajectory. The sequence of position points is obtained by positioning.

According to one embodiment of the invention, a level-1 region B is called a valid neighbor of a level-1 region A when it satisfies the following conditions: the level-1 region B is a neighbor level-1 region of the level-1 region A; and the level-1 region B has at least one neighbor level-1 region, in addition to the level-1 region A, which is not a neighbor level-1 region of the level-1 region A.

According to one embodiment of the invention, a level-1 region B is called a neighbor level-1 region of a level-1 region A when it satisfies the following conditions: the level-1 region B meets at least in part with the level-1 region A at an edge; or the level-1 region B meets with the level-1 region A on a corner, and there is no other level-1 region, which meets at least in part with the level-1 region A at an edge, meets at least in part with the level-1 region B at an edge.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   aggregating a plurality of grid cells partitioned in advance on a trajectory map based on trajectories in each grid cell of the plurality of grid cells to form level-1 regions, where the trajectories comprise routes traveled by vehicles, and wherein each trajectory of the trajectories is represented as a sequence of position points on the trajectory map;
   generating a link of a road network by merging a level-1 region having two valid neighbors with its neighbor level-1 regions having two valid neighbors, wherein a level-1 region B is called a valid neighbor of a level-1 region A when it satisfies the following conditions:
   the level-1 region B is a neighbor level-1 region of the level-1 region A; and
   the level-1 region B has at least one neighbor level-1 region, in addition to the level-1 region A, which is not a neighbor level-1 region of the level-1 region A;

generating a node of the road network by merging a level-1 region having three or more valid neighbors with its neighbor level-1 regions having three or more valid neighbors;

constructing a map of the road network using the link and the node, wherein the link corresponds to a road segment on the map and the node corresponds to a meeting point of at least two road segments on the map; and representing a trajectory of the trajectories by replacing the sequence of position points with a set containing at least one of: the link and the node.

2. The method according to claim 1, wherein the aggregating a plurality of grid cells partitioned in advance on a trajectory map based on trajectories in each grid cell of the plurality of grid cells comprises:

aggregating the plurality of grid cells based on a density of trajectories in each grid cell of the plurality of grid cells partitioned in advance on the trajectory map.

3. The method according to claim 2, wherein a size of the plurality of grid cells is set based on a preset spatial accuracy of the road network and a number limit of aggregated cells in each direction.

4. The method according to claim 3, wherein the size of the plurality of grid cells is equal to or less than a quotient obtained by dividing the spatial accuracy of the road network by the number limit of aggregated cells.

5. The method according to claim 3, wherein the aggregating the plurality of grid cells based on a density of trajectories in each grid cell of the plurality of grid cells partitioned in advance on the trajectory map comprises:

in the case that the number limit of aggregated cells is not reached:
if it is determined that in an adjacent grid cell of a present grid cell there are enough trajectories different from the trajectories in the present grid cell, aggregating the present grid cell and the adjacent grid cell, otherwise, taking the present grid cell as a level-1 region.

6. The method according to claim 5, wherein the determining that in the adjacent grid cell adjacent of the present grid cell there are enough trajectories different from the trajectories in the present grid cell comprises:

computing a number of trajectory segments in the present grid cell and a number of trajectory segments in the adjacent grid cell;

adding a computed number of trajectory segments in the present grid cell and a computed number of trajectory segments in the adjacent grid cell, to get a sum number of trajectory segments;

subtracting a number of trajectory segments in the adjacent grid cell, which are located on a same trajectory as the trajectory segments in the present grid cell, from the sum number of trajectory segments, to get a sum number of valid trajectory segments; and determining that in the adjacent grid cell adjacent of the present grid cell there are enough trajectories different from the trajectories in the present grid cell, if the sum number of valid trajectory segments exceeds the number of trajectory segments in the present grid cell by a certain amount.

7. The method according to claim 6, wherein the computing the number of trajectory segments in the present grid cell and the number of trajectory segments in the adjacent grid cell comprises:

scanning a sequence of position points contained in each trajectory, the sequence of position points being obtained by positioning.

8. The method according to claim 1, wherein a level-1 region B is called a neighbor level-1 region of a level-1 region A when it satisfies the following conditions:

the level-1 region B meets at least in part with the level-1 region A at an edge; or the level-1 region B meets with the level-1 region A on a corner, and there is no other level-1 region, which meets at least in part with the level-1 region A at an edge, meets at least in part with the level-1 region B at an edge.

9. An apparatus, comprising:
a processor; and
a computer readable storage medium having computer readable program instructions stored thereon for causing the processor to carry out operations comprising:

aggregating a plurality of grid cells partitioned in advance on a trajectory map based on trajectories in each grid cell of the plurality of grid cells to form level-1 regions, where the trajectories comprise routes traveled by vehicles, and wherein each trajectory of the trajectories is represented as a sequence of position points on the trajectory map;

generating a link of the road network by merging a level-1 region having two valid neighbors with its neighbor level-1 regions having two valid neighbors, wherein a level-1 region B is called a valid neighbor of a level-1 region A when it satisfies the following conditions:

the level-1 region B is a neighbor level-1 region of the level-1 region A; and the level-1 region B has at least one neighbor level-1 region, in addition to the level-1 region A, which is not a neighbor level-1 region of the level-1 region A;

generating a node of a road network by merging a level-1 region having three or more valid neighbors with its neighbor level-1 regions having three or more valid neighbors;

constructing a map of the road network using the link and the node, wherein the link corresponds to a road segment on the map and the node corresponds to a meeting point of at least two road segments on the map; and representing a trajectory of the trajectories by replacing the sequence of position points with a set containing at least one of: the link and the node.

10. The apparatus according to claim 9, wherein the aggregating comprises:

aggregating the plurality of grid cells based on a density of trajectories in each grid cell of the plurality of grid cells partitioned in advance on the trajectory map.

11. The apparatus according to claim 10, wherein a size of the plurality of grid cells is set based on a preset spatial accuracy of the road network and a number limit of aggregated cells in each direction.

12. The apparatus according to claim 11, wherein the size of the plurality of grid cells is equal to or less than a quotient obtained by dividing the spatial accuracy of the road network by the number limit of aggregated cells.

13. The apparatus according to claim 11, wherein the aggregating the plurality of grid cells based on a density of trajectories in each grid cell of the plurality of grid cells partitioned in advance on the trajectory map comprises:

in the case that the number limit of aggregated cells is not reached:
  if it is determined that in an adjacent grid cell of a present grid cell there are enough trajectories different from the trajectories in the present grid cell, aggregating the present grid cell and the adjacent grid cell, otherwise, taking the present grid cell as a level-1 region.

14. The apparatus according to claim 13, wherein the determining that in the adjacent grid cell adjacent of the present grid cell there are enough trajectories different from the trajectories in the present grid cell comprises:
  computing a number of trajectory segments in the present grid cell and a number of trajectory segments in the adjacent grid cell;
  adding a computed number of trajectory segments in the present grid cell and a computed number of trajectory segments in the adjacent grid cell, to get a sum number of trajectory segments;
  subtracting a number of trajectory segments in the adjacent grid cell, which are located on a same trajectory as the trajectory segments in the present grid cell, from the sum number of trajectory segments, to get a sum number of valid trajectory segments; and
  determining that in the adjacent grid cell adjacent of the present grid cell there are enough trajectories different from the trajectories in the present grid cell, if the sum number of valid trajectory segments exceeds the number of trajectory segments in the present grid cell by a certain amount.

15. The apparatus according to claim 14, wherein the computing the number of trajectory segments in the present grid cell and the number of trajectory segments in the adjacent grid cell comprises:
  scanning a sequence of position points contained in each trajectory, the sequence of position points being obtained by positioning.

16. The apparatus according to claim 9, wherein a level-1 region B is called a neighbor level-1 region of a level-1 region A when it satisfies the following conditions:
  the level-1 region B meets at least in part with the level-1 region A at an edge; or
  the level-1 region B meets with the level-1 region A on a corner, and there is no other level-1 region, which meets at least in part with the level-1 region A at an edge, meets at least in part with the level-1 region B at an edge.

* * * * *